(12) United States Patent
Luebke et al.

(10) Patent No.: US 6,525,665 B1
(45) Date of Patent: Feb. 25, 2003

(54) ELECTRICAL CIRCUIT TRACING DEVICE

(75) Inventors: Thomas M. Luebke, Menomonee Falls, WI (US); David L. Wiesemann, Pewaukee, WI (US); George R. Steber, Mequon, WI (US); Raymond H. Klein, Milwaukee, WI (US)

(73) Assignee: GB Tools and Supplies, Inc., Milwaukee, WI (US)

( * ) Notice: Subject to any disclaimer, the term of this patent is extended or adjusted under 35 U.S.C. 154(b) by 0 days.

(21) Appl. No.: 09/935,093

(22) Filed: Aug. 22, 2001

(51) Int. Cl.[7] .............................................. G08B 21/00
(52) U.S. Cl. ........................ 340/635; 340/652; 327/149; 327/133
(58) Field of Search ................................ 340/635, 649, 340/650, 651, 652; 324/133, 72.5, 149, 74

(56) References Cited

U.S. PATENT DOCUMENTS

| | | | | |
|---|---|---|---|---|
| 3,987,364 A | * | 10/1976 | MacCormack | 324/149 |
| 4,176,315 A | * | 11/1979 | Sunnarborg | 324/149 |
| 4,259,635 A | * | 3/1981 | Triplett | 324/149 |
| 4,533,864 A | * | 8/1985 | Austin | 324/149 |
| 4,929,902 A | * | 5/1990 | Nelson | 324/542 |
| 5,270,638 A | * | 12/1993 | Mellott | 324/133 |
| 5,424,630 A | * | 6/1995 | Vazquez | 324/72.5 |

* cited by examiner

Primary Examiner—Anh La
(74) Attorney, Agent, or Firm—Quarles & Brady LLP

(57) ABSTRACT

An electrical circuit tracing device comprising a transmitter that includes a pocket for storing the receiver is disclosed. The transmitter further comprises a storage compartment for maintaining a plurality of pre-wired connectors, and a clip which can be used to attach the transmitter to a pocket, a belt, or another carrying device.

22 Claims, 7 Drawing Sheets

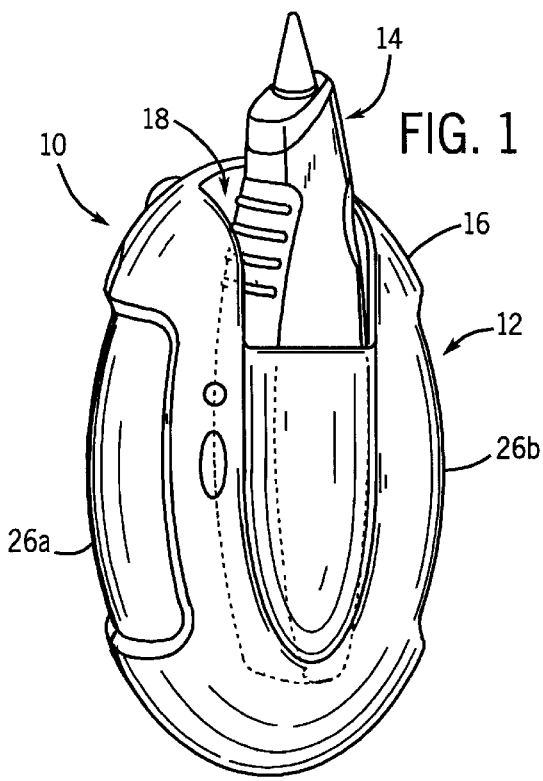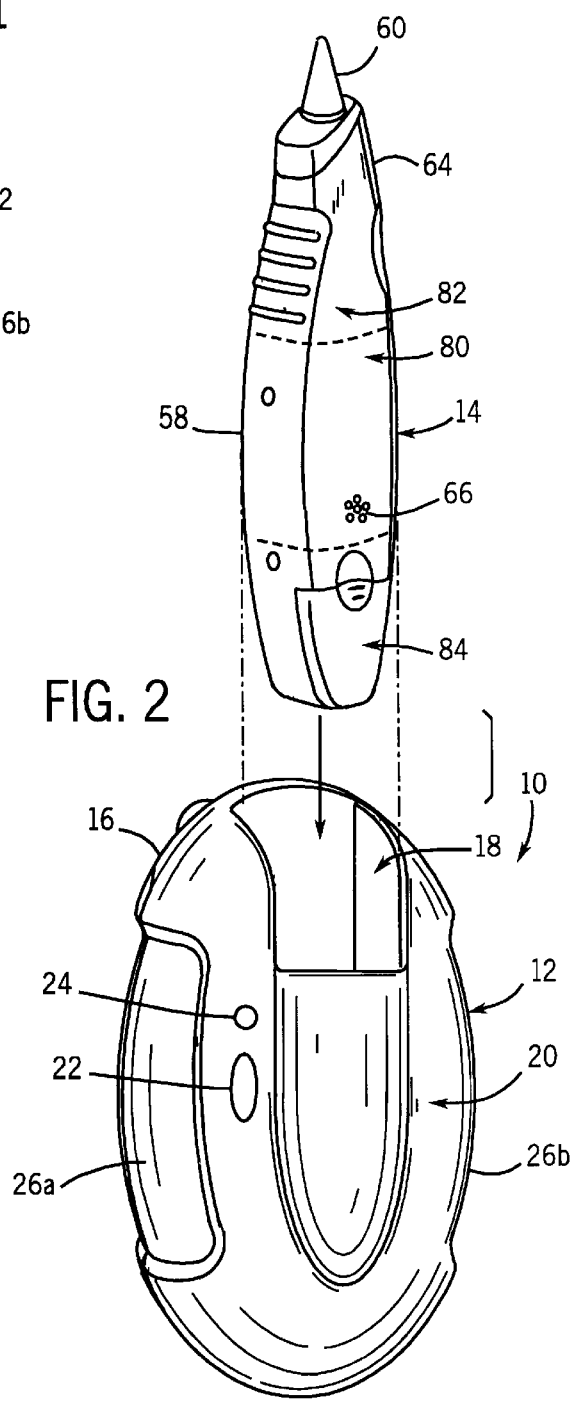

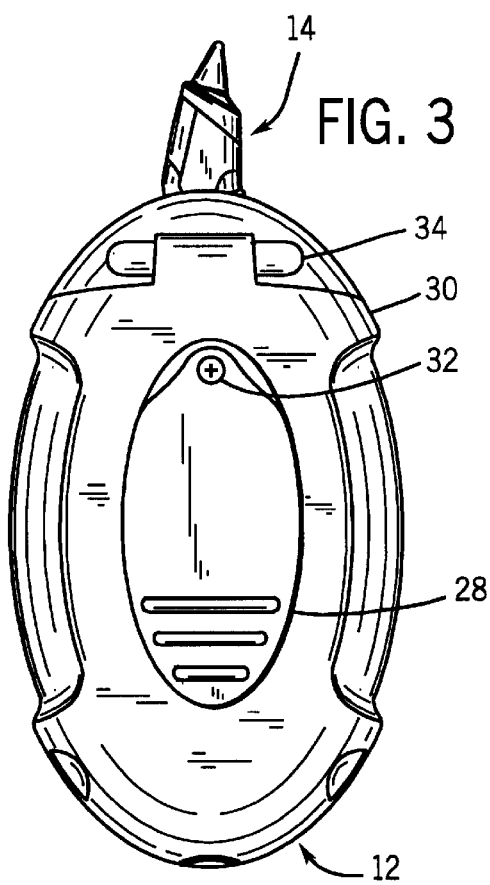
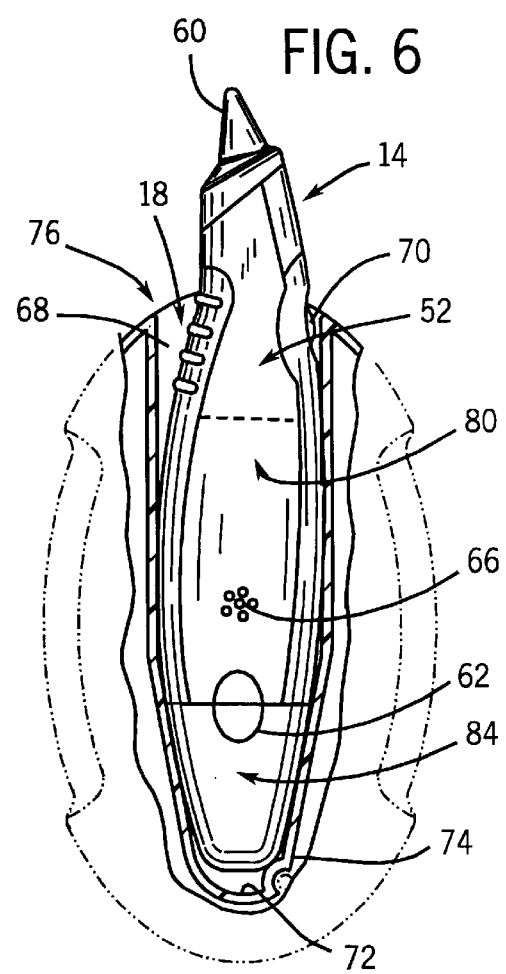

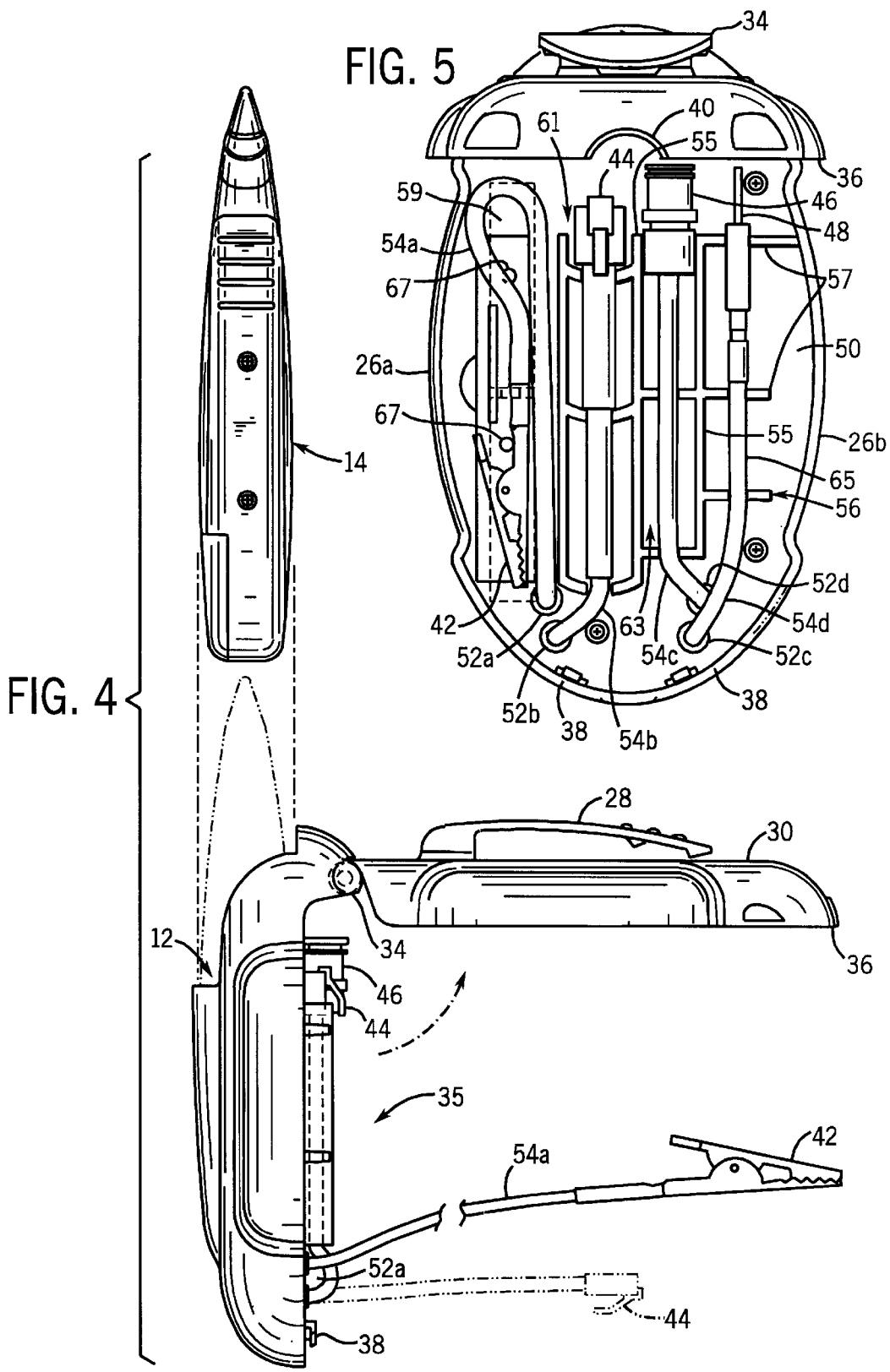

ELECTRICAL CIRCUIT TRACING DEVICE

FIELD OF THE INVENTION

The present invention relates to an apparatus for tracing of electrical conductors where the path of the conductors to be traced is not readily observable due to either surrounding structure or the conductors' disposition among many conductors of similar appearance. More particularly, this invention pertains to a tracing apparatus which combines a number of features to simplify use of the device.

BACKGROUND

In electrical installations, a number of electrical conductors are frequently routed through structures which hide the conductors from view. Examples are readily found in the average home, where telephone, cable television, and electrical wiring is generally located behind the wall, where it does not disrupt the appearance of the home, and where interaction between the wiring and the residents of the home is minimized. Similarly, in industrial installations, electrical wiring is frequently bundled and confined in an out of the way location, where accidental intervention with the wiring cannot occur.

In such installations, individual conductors can, therefore, be difficult to test, both because the tester cannot readily see the conductor, and because a specific conductor is difficult to isolate in a large number of conductors having a similar appearance. In these situations, the route of a specific conductor cannot be readily ascertained by visual tracing.

Because of the difficulty of tracing wires in walls or other conduits, or in a large bundle of similar wires, line or wire tracing devices have been developed. Wire tracing devices generally comprise a transmitter for transmitting an electromagnetic signal along a wire to be tested, and a receiver for wirelessly detecting the signal at another location in the wire. The electromagnetic signal is preferably a distinct modulated signal in the audio range. The receiver acts as an antenna, receiving and supplying the audio signal to provide an audio signal, the strength of which varies depending on the distance of the receiver from the wire carrying the audio can signal. Preferably, the receiver also includes a light emitting diode, which is lit to indicate a detected signal. Like the audio signal, the intensity of the light preferably increases as the receiver approaches an active wire.

The transmitter device is preferably stationary, and is electrically coupled directly to the wire to be tested. Typically, the transmitter comprises a circuit powered by a relatively large nine volt D cell battery, and the amplitude of signals produced by the battery are limited to nine volts. Furthermore, the nine volt power supply must supply a relatively large level of current to provide sufficient signal for detection.

The receiver device is a moveable, hand-held device, which can be moved along the outside of a wall or conduit to detect the transmitted signal, thereby providing an indication both of where the wire is routed and whether electrical continuity exists in the wire.

Wire testing and tracing devices, therefore, generally comprise a number of components. As noted above, the test unit itself comprises both a transmitter device and a handheld receiver, where the transmitter device must be relatively large to accommodate the nine volt battery power source. To trace wires in, for example, a home, a number of connectors are also required. For example, in a home inspection, a tester may need to test telephone, cable television, and AC voltage connectors. Although typical connectors such as alligator clips can be used for such testing, these devices generally require cutting and stripping of wires. Therefore, testers generally require specific phone jack, coaxial cable, and a straight blade AC electrical connectors which can be connected directly to existing wires without the need for stripping or cutting conductors. Furthermore, because the current levels supplied by the nine volt battery are high, spare batteries are often required. Because of the size of the components, as well as the large number of both components and connectors required, typical wire tracing devices, therefore, must be carried in a bag or carrying case.

Carrying cases and bags, however, can be problematic for the electrician or technician in the testing environment. The tracing of wires, for example, is generally only the first step in an electrical test. A technician or electrician therefore often requires a number of additional testing devices including voltmeters, current detecting devices, and other electrical testing equipment. The need for a bag or carrying case for each individual piece of equipment can cause significant inconvenience when all of the equipment must be carried by a single user. Furthermore, when a plurality of connectors and testing devices are maintained in a bag or carrying case, required parts of the testing equipment are frequently lost. Such equipment, for example, is frequently stored in a pocket or with another piece of test equipment rather than returned to the appropriate bag after testing. Such equipment is also frequently "borrowed" for another application and not returned. Furthermore, loose connectors and other equipment is frequently left behind when the testing is completed.

There remains a need, therefore, for a wire tracing device which simplifies the use and storage of wire tracing equipment.

SUMMARY OF THE INVENTION

The present invention is a wire tracing or electrical circuit tracing device which provides a transmitter, receiver, and a plurality of connectors in a single, compact, easy-to-use, easy-to-transport package.

To decrease the size of the device, the transmitter circuit is designed to operate on a low voltage supply, and can be operated with small triple A batteries, as opposed to the nine volt battery required in prior art devices. The transmitter is preferably operated on a three volt supply, which is amplified by a step up transformer to provide an operating voltage of approximately 20 volts, thereby providing a more robust signal than prior art devices. A small, inexpensive microcontroller controls and generates the signal, and also provides a sleep function, wherein the transmitter is automatically turned off after a predetermined operation time.

The transmitter circuitry of the wire tracing device is enclosed in a multi-functional housing. The housing is formed to include a pocket dimensioned to hold the receiver, thereby providing a location for storing the individual parts of the wire tracing device in a single package without the need for an external case or bag. Furthermore, a clip is coupled to the back of the housing in such a way that the transmitter can be snap fit onto a belt or other carrying device in order to eliminate the need to separately carry the wire tracer. The housing of the transmitter in effect provides a "holster" for storing and transporting the wire tracing device.

To further simplify the use of the device, the housing of the transmitter section includes a storage rack designed to hold a plurality of common electrical connectors. The connectors can, for example, include a phone jack, a coaxial connector, and a male straight blade connector, each of which can be snap fit into the rack, where the connector is held in place during transportation.

Each of the connectors is preferably electrically coupled to the internal transmitter circuitry such that, when a test is required, a user need only connect the appropriate connector to a matching socket, and then activate the receiver to trace the line. Because the connectors are pre-wired to the testing device, the connectors cannot be lost or misplaced. Furthermore, the connectors provide easy access to a number of common connections, without the need for cutting or stripping wires.

Preferably, the storage rack and associated electrical connectors are coupled to the storage compartment which can be closed by shutting a lid. The lid is preferably hinged, and can include one or more latching devices for holding the lid in a closed position when the wire tracing device is not in use.

These and other objects and advantages of the invention will be apparent from the detailed description and drawings.

BRIEF DESCRIPTION OF THE DRAWINGS

FIG. 1 is a perspective view of an electrical circuit tracer constructed in accordance with the present invention;

FIG. 2 is an exploded view of the electrical circuit tracer of FIG. 1, the exploded view showing the separate transmitter and receiver components;

FIG. 3 is a rear plan view of the electrical circuit tracer of FIG. 1;

FIG. 4 is a side exploded view of the electrical circuit tracer of FIG. 1 showing a back lid of the device in an open position;

FIG. 5 is a rear plan view of the transmitter showing the back lid of FIG. 4 in the open position;

FIG. 6 is a fragmentary side sectional view of the transmitter of the electrical circuit tracer of FIG. 1 showing an internal pocket in which the receiver is positioned;

DETAILED DESCRIPTION OF THE PREFERRED EMBODIMENT

Figure 7:
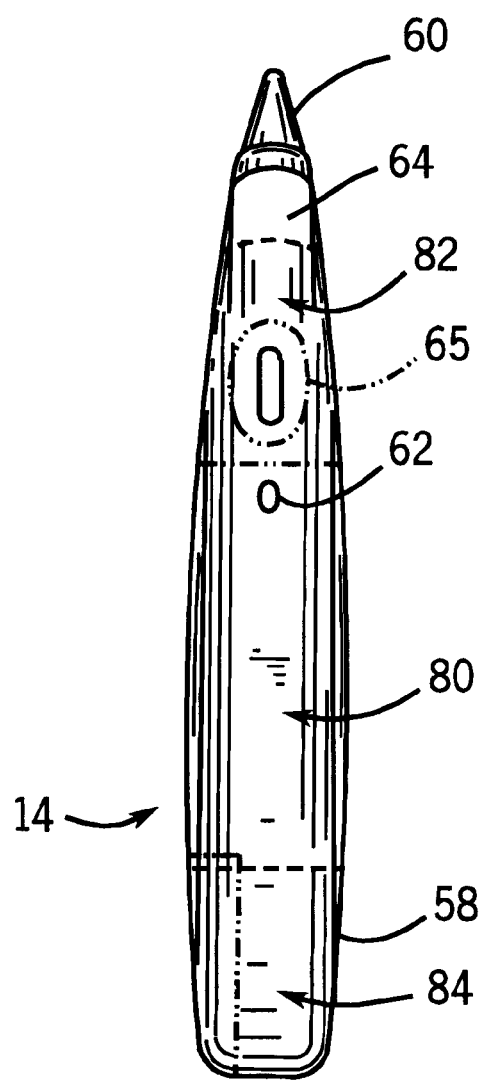
FIG. 7 is a rear plan view of the receiver of the electrical circuit tracer of FIG. 1.

Referring now to the Figures and more particularly to FIGS. 1 and 2, an electrical circuit tracing device constructed in accordance with the present invention is shown at 10. The electrical circuit tracing device 10 generally comprises two parts: a transmitter 12 for transmitting a signal along a wire to be tested, and a receiver 14 for detecting the signal from the transmitter 12 and for providing an indication that a conductor is carrying the transmitted signal. The transmitter 12 comprises a housing 16 configured to include a pocket 18, wherein the pocket 18 is dimensioned to receive and store the receiver 14, as described more fully below. A depression 26a and 26b is defined in each of the opposing sides of the housing 16, the depressions 26a and 26b allowing for a user to easily grip and carry the transmitter 12.

Referring still to FIGS. 1 and 2, the front panel 20 of the housing 16 includes an ON/OFF switch 22, and an indicator light or light emitting diode (LED) 24. Circuitry for providing the transmission function (FIG. 8) is enclosed in the housing 16, and is activated by the ON/OFF switch 22. When the ON/OFF switch 22 is placed in the ON position, the LED 24 is lit to indicate that the electrical wire tracer is active. Although a specific circuit for providing the transmission function is shown and described below, a number of different transmitter and receiver pairs can be advantageously employed in conjunction with the disclosed housing, storage, and other concepts.

Referring now to FIG. 3, a back view of the transmitter 12 is shown. The back of the transmitter 12 includes a clip 28 which is coupled to the housing 16. The clip 28 comprises a flexible material, such as plastic, rubber, certain types of metals, or other materials such that the clip 28 can be pulled away from the housing 16 and positioned on the opposing side of a carrying device from the housing 16. The carrying device can be, for example, a pocket, belt, the edge of a carrying case, or any of a number of different mounting materials to which it is convenient to temporarily couple the electrical wire tracing device. Once the clip 26 is positioned over the material, the clip 26 is allowed to flex closed against the housing 16 such that the carrying device is held between the clip and the housing 16. The clip 26 can be coupled to the housing 16 with a coupling device 32 such as a threaded screw, a rivet, or any of a number of other devices known to those of skill in the art.

Referring now to FIGS. 3 and 4, the back of the transmitter 12 preferably also includes a lid 30 which is mounted to the housing 16 with a hinge 34, such that the lid 30 can be selectively open and shut to reveal a storage compartment 35. In the closed position, (FIG. 3), the lower edge 36 of the lid 30 is locked in place by means of a light snap fit with one or more locking catches 38. The lower edge 36 also preferably defines a semi-circular finger hole 40 which can be accessed by the user to apply a force to the lid 30 to release the lid 30 from the locking catches 38.

Figure 8:
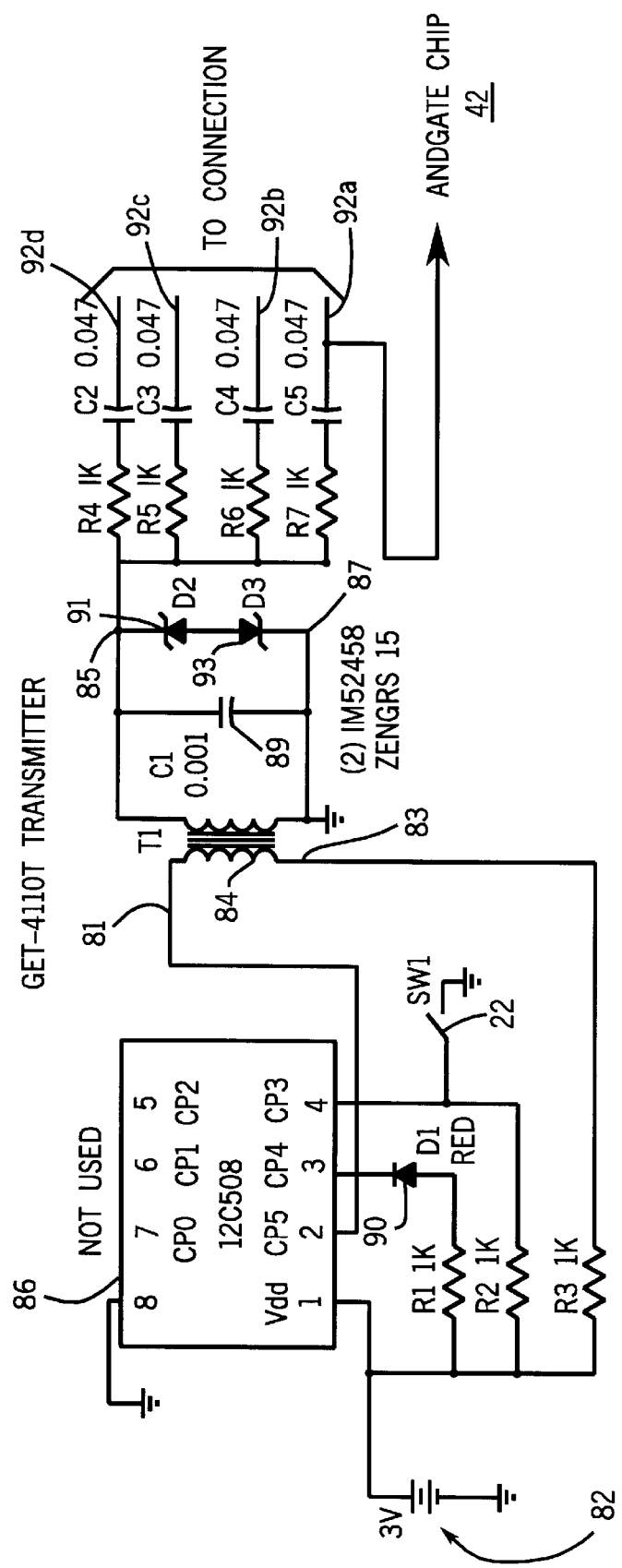
FIG. 8 is a circuit diagram of a transmitter circuit constructed in accordance with the present invention.

Referring now to FIGS. 4 and 5, when the lid 30 is in the open position, a plurality of connectors and associated leads 54a–d in the storage compartment 35 are accessible to a user. The connectors can include, as shown, an alligator clip 42, telephone jack 44, coaxial connector 46, and a straight blade 48. Each of these connectors 42, 44, 46, and 48 are coupled to a lead 54 which is, in turn, electrically coupled to the transmitter circuit housed between the housing 16 and a base plate 50 of the storage compartment 35. A plurality of apertures 52a–d are defined in the base plate 50 through which the leads 54 can be routed to connection points on the transmitter circuit (FIG. 8). The base plate 50 also includes a storage rack 56 for receiving the leads 54 and associated connectors 42, 44, 46, and 48. Preferably, the storage rack 56 is sized and dimensioned to allow the selected connectors and leads 54 to be snap fit in place, thereby simplifying closure of the lid 30 and transportation of the electrical circuit testing device. As shown, the storage rack 56 comprises a plurality of vertical dividers 55 which divide the storage compartment 35 into four separate compartments 59, 61, 63, and 65 for storing each connector 42, 44, 46, and 48 and the associated leads 54a–d. The vertical dividers 55 extend in a substantially perpendicular direction upward from the base 35. In the compartments 61, 63, and 65, the vertical dividers 55 are coupled to a plurality of horizontal or generally horizontal cross bars 57. The cross bars 57 extend from each side of the vertical dividers 55 into the adjacent compartment a distance less than one half the distance across the compartment, thereby leaving a space between the horizontal cross bars 57 coupled to adjacent vertical dividers 55 in which the leads 54a through 54d can be snap fit. The compartment 59 includes one or more cylindrical pegs 67 extending in a direction substantially perpendicular to the base, the pegs providing a means for winding the lead 54a into the compartment, and for snap fitting the lead 54a in place.

Each of the connectors 42, 44, 46, and 48 is pre-wired to allow transmission of an electrical signal from the transmitter circuit, through the lead 54 to the connector 42, 44, 46, and 48. The telephone jack connector 44 is wired to be coupled directly to an associated female telephone jack socket, and to transmit a signal directly along the telephone wiring to trace the associated circuit. Similarly, the coaxial cable connector 46 is wired to be coupled directly to a coaxial cable socket, and the straight blade connector 48 to be coupled to either side of an electrical power socket. Therefore, connectors for a number of frequently-probed circuits are readily available to a user. The alligator clip 42 allows for probing of any other wire or connector coupled to a circuit requiring tracing.

Referring now to FIG. 6, the pocket 18 is shown as sized and dimensioned to receive the receiver 14. The pocket 18 includes internal side walls 68 and 70 which are tapered inward, such that the pocket is widest at the top aperture 76 and narrows as it approaches the bottom wall 72 of the pocket. The bottom wall 72 includes a ridge 74, extending into the pocket 18 from the corner formed by the bottom wall 72 and side wall 70.

Referring again to FIG. 2, the receiver 14 comprises a receiver circuit (FIG. 9) housed in an elongated housing 58. A distal end of the housing 58 comprises a sensor tip 60 which is to be directed at a wire to detect a signal transmitted from the transmitter 12, as shown in FIG. 10. Referring still FIG. 2, the housing 58 of the receiver 14 further comprises a speaker 66 which provides an audio signal generated by an internal circuit (FIG. 9) when a transmitted signal is detected. Referring now to FIG. 7, the receiver 14 further comprises an ON/OFF switch 62 and an indicator light 64 that provides a visual indication when a signal has been detected. A thumbwheel 65 establishes the maximum strength of the output signal provided by the speaker 66 and the indicator light 64.

Referring still to FIG.2, the housing 58 of the receiver 14 is designed in a pen-shaped configuration which allows for easy handling by a user when tracing a wire. The circumference of the housing 58 is varied such that the circumference of a middle portion 80 is wider than that of a top portion 82 and bottom portion 84. A portion, for example the front 59 and back 61, of the receiver 14 is rubberized to provide a good grip for the user, and also to retain the receiver 14 in the pocket 18, as discussed below.

Referring now to FIGS. 2, 4 and 6, as noted above, the pocket 18 and receiver 14 are sized and dimensioned to allow selective placement of the receiver 14 in the pocket 18 of the transmitter 12 for storage. Also as noted above, the pocket 18 is widest at the top 76, and narrows as it approaches a bottom wall 72. The relatively narrow bottom portion 84 of the receiver 14 can therefore be slid through the pocket 18 until it contacts the ridge 74 extending from the bottom wall 72 of the pocket 18. As the receiver 14 is inserted into the pocket 18, the wider middle portion 80 of the receiver 14 is friction fit against the narrowing inner walls 68 and 70. To provide a stronger frictional force, the rubberized front 59 and back 61 deform to provide a frictional surface to help hold the receiver 14 in the pocket 18. The frictional fit of the wider middle portion 80 of the receiver 14 in the pocket 18 combines with a force imposed on the receiver by the ridge 74 to hold the receiver 14 in position in the pocket 18, even when the transmitter 12 and receiver 14 are subjected to forces which tend to separate them. For example, the receiver can be held in place even when the combined transmitter 12 and receiver 14 is turned sideways or upside down.

Referring now to FIG. 8, the transmitter circuit in the transmitter 12 provides three basic functions: modulating a signal for transmission in the audio range of frequencies, amplifying the voltage of the transmission signal, and providing the transmission signal to the connectors 42, 44, 46, and 48 described above. To provide these functions, the major components of the transmitter circuit include a voltage source 82, a step-up transformer 84, and a microcontroller 86.

The microcontroller 86 is a low voltage component, requiring only a three volt DC power supply for operation. The voltage source 82 can therefore be small, and is preferably provided by two triple A batteries. Software stored in the microcontroller 86 provides a modulated output signal in the audio range. The output signal is applied to the input of the step-up transformer 84 at points 81 and 83 to increase the magnitude of the signal for transmission. The microcontroller 86 also provides a timing function, which causes the electrical circuit tracing device 10 to enter a "sleep" mode after a predetermined operation time of, for example, thirty minutes. In the "sleep" mode, the transmitter circuit draws very little current, and therefore the life of the batteries supplying the voltage source 82 is extended significantly. Activation of the momentary switch 22 re-activates the microcontroller 86 and ends the "sleep" mode, and thereby provides a function of toggling the microcontroller 86 between a "sleep" and an "awake" mode.

The step up transformer 86 receives the modulated input voltage from the voltage source 82 between points 81 and 83 and steps the voltage up such that the output voltage between pins 85 and 87 is about twenty volts for a three volt input signal. The output is limited by zener diodes 91 and 93, and filtered by capacitor 89. The modulated output signal is electrically coupled to each of the connectors 42, 44, and 48 through an RC filter circuit 92a, 92b, 92c, and 92d respectively for transmission along a wire being traced.

Figure 9:
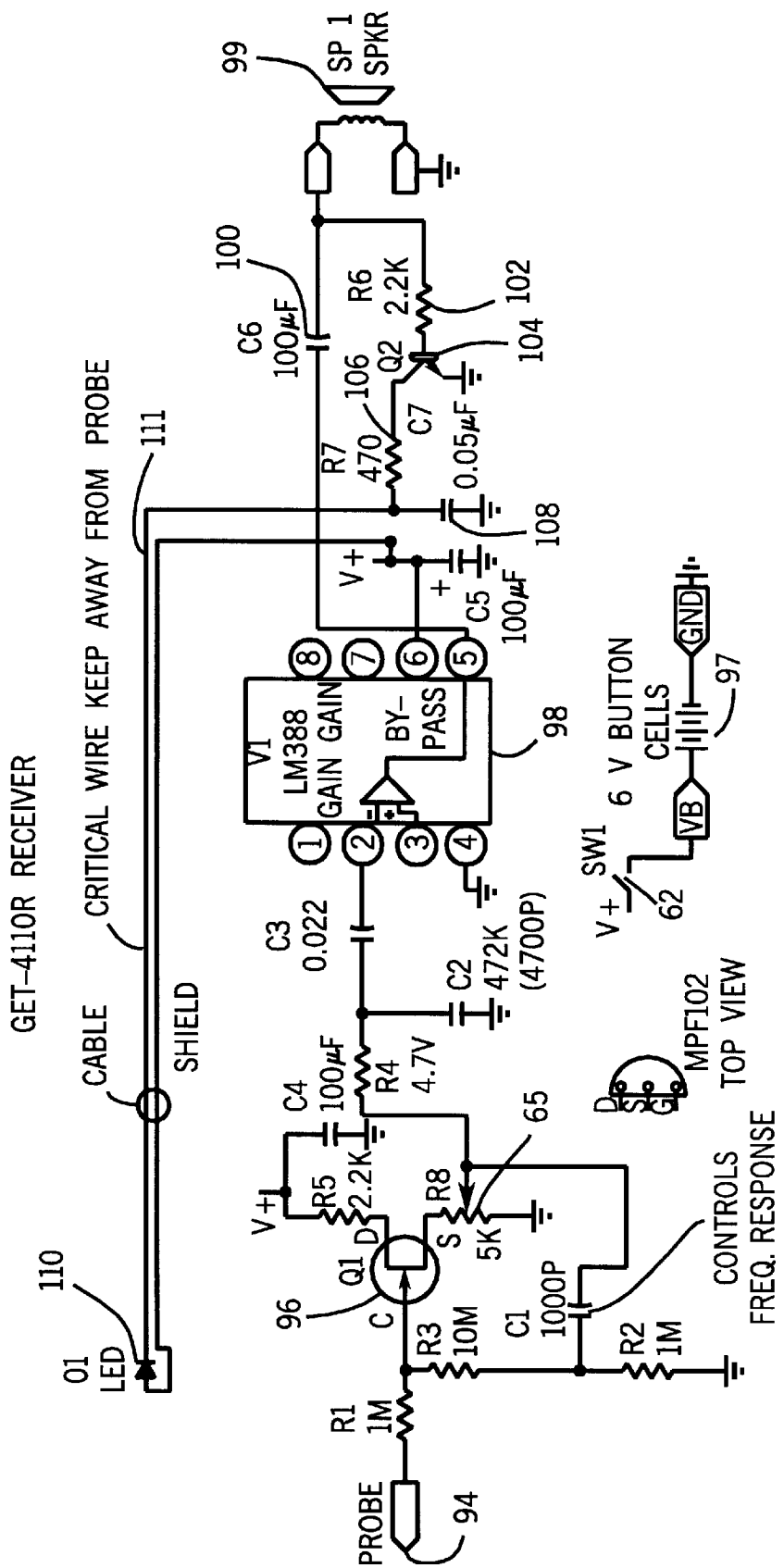
FIG. 9 is a circuit diagram of a receiver circuit for use in conjunction with the transmitter circuit of FIG. 8.
Figure 10:
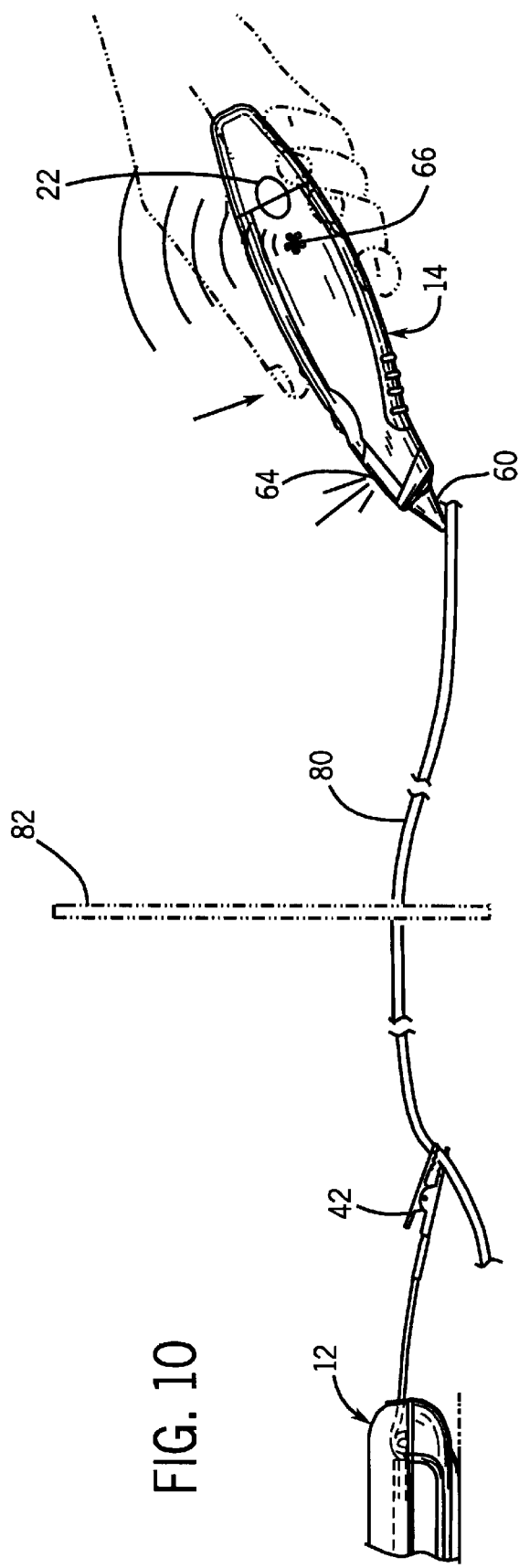
FIG. 10 is an illustration of the electrical circuit tracing device in use tracing an electrical circuit.

Referring now to FIG. 9, the receiver circuit of the receiver 14 is activated by the switch 62 which applies a voltage from power source 97 to the circuit. The power source 97 preferably comprises a plurality of button cells providing a total of 6 volts which provide sufficient power in a small, easy-to-handle space.

The activated receiver circuit detects the transmitted signal, and provides both an audio and visual output signal, the strength of which are scaled to be indicative of the strength of the detected transmission signal. The transmitted signal is detected by the receiver at the probe 94, located in the sensor tip 60 of the receiver 14 as discussed above. The detected signal is amplified by transistor 96, the maximum and minimum output of which are controlled by the user though the potentiometer 97 activated by the thumbwheel 65 described above. The output of the transistor 96 is presented to the audio power amplifier 98, which amplifies the signal. The amplified signal is electrically coupled to the speaker 99 via capacitor 100, such that the speaker 99 provides an audio output signal having a signal strength indicative of the strength of the transmitted signal.

The amplified signal also enables transistor 104 via resistor 102. The transistor 104 operates in conjunction with resistor 106, capacitor 108 and LED 110 to provide a visual output signal that varies with the strength of the detected signal. The relative positions of the resistor 106 and diode 110, which are reversed in most similar applications, are important in the receiver configuration shown to prevent positive feedback from affecting operation of the LED 110. Positive feedback can result, for example, when there is a large voltage signal on the wires or cable to LED 110. In this case, if the positions of resistor 106 and LED 110 are reversed there can be a voltage signal as large as 6 volts AC on the LED 110 wire. Since LED 110 is so close physically to the probe 94, the probe could detect the LED 110 signal, which would be undesirable. However with the LED 110 connected as shown, the signal on the LED 110 is only about 1 volt AC; a significant reduction which allows the placement of the LED 110 near the probe, as desirable when using the receiver 14. Potential feedback problems are further reduced by connecting the LED 110 to the circuit with a shielded cable 111. The shielded cable is routed in the receiver 14 such that the cable 111 is not in close proximity with the probe 94.

Referring now to FIG. 10, the electrical circuit tracer 10 is shown as used to trace an electrical circuit. The transmitter 12 is electrically coupled to a wire 80 that extends on two sides of an obstruction 82 with the alligator clip 42. The transmitter 12 transmits an electromagnetic signal along the wire 80. The sensor tip 60 of the receiver 14 is directed at the wire 80, in order to detect the transmitted signal. No electrical contact between the tip 60 and the conductor 80 is necessary since detection is accomplished by capacitive coupling. When the transmitted electromagnetic signal is detected by the receiver 14, the indicator light 64 is lit and an audio signal is emitted from the speaker 66. Although the receiver 14 is shown in close proximity to the wire 80 and on the same side of the obstruction 82 as the wire 80 for clarity, the receiver 14 can detect the electromagnetic signal through common obstructions such as a wood or plaster wall. The electrical circuit tracer 10 is often used to trace a wire that cannot be seen by the user.

It should be understood that the methods and apparatuses described above are only exemplary and do not limit the scope of the invention, and that various modifications could be made by those skilled in the art that would fall within the scope of the invention. For example, although a number of distinctive features, including a covered storage compartment, pre-wired attached leads, a pocket for storing the receiver, and a clip for attaching the device to a selected carrying device have been described as a single embodiment, each of these features can be provided separately or in various combinations to provide a novel electrical circuit tracer.

Additionally, although a specific shape has been shown for each of the transmitter and receiver component parts, it will be apparent that variations can be made to these configurations within the scope of the invention. Various known types of lids, locking devices, and hinges can be employed to provide a storage compartment. Furthermore, various types of coupling means and other devices can be used to maintain the receiver in the pocket of the transmitter. Additionally, the pocket and storage compartment could be formed in a housing of the receiver portion of the electrical circuit testing device, as well as the transmitter side.

Also, different connectors can be pre-wired to the leads of the storage compartment depending on the expected application of the device. Furthermore, the storage compartment and/or associated storage rack could be used to store loose wires and associated connectors, and the transmitter could include associated plugs or sockets for coupling loose wires to the transmitter circuitry. Other such modifications will be apparent to those of ordinary skill in the art. To apprise the public of the scope of this invention, the following claims are made:

We claim:

1. An electrical circuit tracing device, the device comprising:
   a transmitter including a transmitter circuit and a transmitter housing, the transmitter housing defining a pocket;
   a connector connected to said transmitter and connectable to a conductor to be traced; and
   a wireless receiver including a receiver circuit for non-contact detection of a signal transmitted from said connector to said conductor to be traced by the electrical circuit tracing device, wherein the pocket of the transmitter housing is dimensioned to receive and store the receiver therein.

2. The electrical circuit tracing device as defined in claim 1, wherein the pocket of the transmitter tapers such that a top aperture is wider than a bottom of the pocket.

3. The electrical circuit tracing device as defined in claim 1, wherein the receiver comprises a middle portion that is relatively wider than a bottom portion, the middle portion providing a frictional force between the internal walls of the pocket and the receiver.

4. The electrical circuit tracing device as defined in claim 1, wherein the pocket includes a ridge extending from a bottom wall.

5. The electrical circuit tracing device as defined in claim 1, wherein the transmitter further comprises a clip for coupling the transmitter to a belt.

6. The electrical circuit tracing device as defined in claim 1, wherein the transmitter further comprises a covered storage compartment.

7. The electrical circuit tracing device as defined in claim 6, wherein the covered storage compartment includes a hinged lid.

8. The electrical circuit tracing device as defined in claim 7, wherein the covered storage compartment includes a plurality of connectors pre-wired to a transmitter circuit.

9. The electrical tracing device as defined in claim 1, further comprising a connector storage rack.

10. The electrical circuit tracing device as defined in claim 7, wherein the hinged lid further comprises a latching device for latching the lid to the housing.

11. An electrical circuit tracing device, comprising:
    a transmitter including a transmitter circuit and a transmitter housing containing the transmitter circuit, the transmitter housing including a storage compartment with a hinged lid, the storage compartment including one or more connectors, each of the connectors being pre-wired to the transmitter circuit for transmitting a signal along a circuit to be traced by the electrical circuit tracing device; and
    a wireless receiver including a receiver circuit for detecting a signal transmitted along the circuit to be traced by the transmitter circuit without contacting the circuit to be traced.

12. The electrical circuit tracing device as defined in claim 11, wherein at least one of the connectors is a coaxial cable connector.

13. The electrical circuit tracing device as defined in claim 11, wherein at least one of the connectors is a telephone jack.

14. The electrical circuit tracing device as defined in claim 11, wherein at least one of the connectors is a straight blade.

15. The electrical circuit tracing device as defined in claim 11, wherein at least one of the connectors is an alligator clip.

16. The electrical circuit tracing device as defined in claim 11, wherein the storage compartment includes a storage rack for selectively coupling the pre-wired connectors to the transmitter housing.

17. The electrical circuit tracing device as defined in claim 11, wherein the storage compartment includes a lid.

18. The electrical circuit tracing device as defined in claim 17, wherein the lid is hinged to the transmitter housing.

19. The electrical circuit tracing device as defined in claim 11, wherein the connectors are pre-wired to the transmitter circuit.

20. An electrical circuit tracing device comprising:

a transmitter selectively coupled to a circuit to be traced to provide a transmitted signal along the circuit, the transmitter including a housing defining a pocket and a storage compartment with a hinged lid, the storage compartment including one or more connectors, each of the connector being pre-wired to the transmitter circuit for transmitting a signal along the circuit to be traced by the electrical circuit tracing device;

a wireless receiver selectively capacitively coupled to the circuit to be traced to detect the transmitted signal, wherein the pocket of the transmitter housing is dimensioned to receive and store the wireless receiver of the electrical tracing device therein; and a clip coupled to the transmitter housing.

21. The electrical circuit tracing device as defined in claim 20, wherein the clip comprises a flexible material which can be pulled back to provide a space for inserting a carrying device between the clip and the housing of the transmitter.

22. The electrical circuit tracing device as defined in claim 20, wherein the transmitter housing further comprises a storage compartment for storing a connector for electrically coupling the transmitter to a circuit to be traced.

* * * * *